US012771171B2

(12) United States Patent
An

(10) Patent No.: US 12,771,171 B2
(45) Date of Patent: Oct. 20, 2026

(54) CHARGING DEVICE AND ELECTRONIC DEVICE ASSEMBLY

(71) Applicant: GUANGDONG OPPO MOBILE TELECOMMUNICATIONS CORP., LTD., Dongguan (CN)

(72) Inventor: Zhongyu An, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 717 days.

(21) Appl. No.: 18/318,173

(22) Filed: May 16, 2023

(65) Prior Publication Data

US 2023/0291236 A1 Sep. 14, 2023

Related U.S. Application Data

(63) Continuation of application No. PCT/CN2021/115823, filed on Aug. 31, 2021.

(30) Foreign Application Priority Data

Nov. 16, 2020 (CN) ........................ 202011281862.8

(51) Int. Cl.
*H02J 50/00* (2016.01)
*H02J 7/70* (2026.01)
(Continued)

(52) U.S. Cl.
CPC ............ *H02J 50/005* (2020.01); *H02J 7/731* (2026.01); *H02J 50/10* (2016.02); *H05K 5/0217* (2013.01); *H05K 5/0247* (2013.01)

(58) Field of Classification Search
USPC ................ 320/106, 107, 108, 109, 110, 112
See application file for complete search history.

(56) References Cited

U.S. PATENT DOCUMENTS 10,263,441 B1 4/2019 Aslan
2017/0054320 A1* 2/2017 Yamanishi ............. H02J 50/10

FOREIGN PATENT DOCUMENTS

CN 101924400 12/2010
CN 103401320 11/2013
(Continued)

OTHER PUBLICATIONS

WIPO, International Search Report and Written Opinion for International Application No. PCT/CN2021/115823, Dec. 2, 2021.
(Continued)

*Primary Examiner* — Brian Ngo
(74) *Attorney, Agent, or Firm* — Hodgson Russ LLP

(57) ABSTRACT

A charging device and an electronic device assembly are provided. The charging device may include a first housing, a second housing defining a receiving space, and a driving assembly and a charging coil. The second housing is rotatably connected with the first housing. The second housing is configured to hold an electronic device. The driving assembly and the charging coil are both received in the receiving space. The driving assembly is connected with the charging coil and configured to drive the charging coil to move in the receiving space. In addition, in the disclosure, movability of the charging coil can be utilized to adjust position of the charging coil, thereby adapting to different models and states of the electronic devices and improving charging efficiency of the charging device.

18 Claims, 11 Drawing Sheets

(51) Int. Cl.
*H02J 50/10* (2016.01)
*H05K 5/02* (2006.01)

(56) References Cited

FOREIGN PATENT DOCUMENTS

| | | | |
|---|---|---|---|
| CN | 103618350 | 3/2014 | |
| CN | 104917219 | 9/2015 | |
| CN | 110021970 | 7/2019 | |
| CN | 110021970 A * | 7/2019 | .............. H02J 50/90 |
| CN | 209217773 | 8/2019 | |
| CN | 110299740 | 10/2019 | |
| CN | 209488236 | 10/2019 | |
| CN | 111224440 | 6/2020 | |
| JP | 2011010378 | 1/2011 | |
| JP | 2013118720 | 6/2013 | |
| KR | 20190075700 | 7/2019 | |
| WO | 2015152461 | 10/2015 | |
| WO | 2015177994 | 11/2015 | |
| WO | 2016147312 | 9/2016 | |

OTHER PUBLICATIONS

JPO, Office Action for JP Application No. 2023-529098, May 21, 2024.
KIPO, Office Action for KR Application No. 10-2023-7018275, Feb. 7, 2025.
CNIPA, First Office Action for CN Application No. 202011281862. 8, Aug. 14, 2024.
IPI, Office Action for IN Application No. 202317039481, Jun. 12, 2026.

* cited by examiner

CHARGING DEVICE AND ELECTRONIC DEVICE ASSEMBLY

CROSS-REFERENCE TO RELATED APPLICATIONS

The application is a continuation of International Application No. PCT/CN2021/115823, filed Aug. 31, 2021, which claims priority to Chinese Patent Application No. 202011281862.8, filed Nov. 16, 2020, the entire disclosures of which are incorporated herein by reference.

TECHNICAL FIELD

This disclosure relates to the field of electronic product technology, and in particular, to a charging device and an electronic device assembly.

BACKGROUND

With the continuous development and widespread use of electronic devices, the number of electronic devices is increasing. As a result, charging devices, as one of peripheral products of the electronic devices, are also receiving more and more attention.

SUMMARY

In view of above, a charging device is provided in a first aspect of the disclosure. The charging device includes a first housing, a second housing defining a receiving space, and a driving assembly and a charging coil. The second housing is rotatably connected with the first housing, and the second housing is configured to hold an electronic device. The driving assembly and the charging coil are both received in the receiving space, and the driving assembly is connected with the charging coil and configured to drive the charging coil to move in the receiving space.

In a second aspect of the disclosure, an electronic device assembly is provided. The electronic device assembly includes an electronic device and the charging device provided in the first aspect. The electronic device includes an induction coil and a battery. The charging coil and the induction coil cooperate to charge the battery

BRIEF DESCRIPTION OF THE DRAWINGS

To describe technical solutions in implementations of the disclosure more clearly, the following introduces the accompanying drawings required for describing the implementations of the disclosure.

Figure 1:
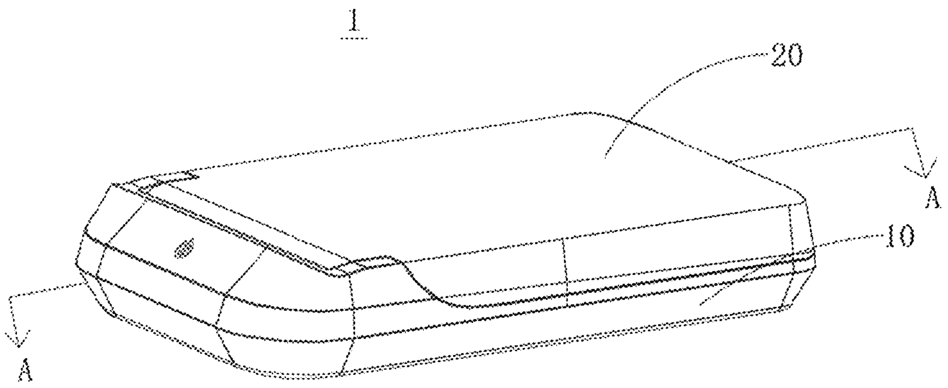
FIG. 1 is a schematic structural view of a charging device in a horizontal state in an implementation of the disclosure.

REFERENCE SIGNS charging device—1, electronic device—2, electronic device assembly—3, induction coil—4, battery—5, first housing—10, accommodating space—100, second housing—20, receiving space—200, bottom wall—21, side wall—22, driving assembly—30, gear assembly—300, rack—301, charging coil—31, motor—32, slider—33, threaded hole—330, connecting portion—331, sliding block—332, lead screw—34, threads—340, first sliding portion—35, second sliding portion—36, support member—37, sliding groove—371, bottom plate—372, side plate—373, sliding space—374, first through hole—375, second through hole—376, third through hole—377, fourth through hole—378, fifth through hole—379, first guide rod—38, second guide rod—381, connecting member—39, holder—40, positioning recess—41, motor assembly—50, processor—60, communication component—61, distance sensor—62, speaker—63, first switch—64, second switch—65.

DETAILED DESCRIPTION

The following are preferred implementations of the disclosure, and it is noted that various improvements and modifications can be made without departing from the principle of the disclosure to those of ordinary skill in the art, and the improvement and the modification are also considered as the protection scope of the disclosure.

A charging device is provided in the implementations. The charging device may include a first housing, a second housing defining a receiving space, and a driving assembly and a charging coil. The second housing is rotatably connected with the first housing. The second housing is configured to hold an electronic device. The driving assembly and the charging coil are both received in the receiving space, and the driving assembly is connected with the charging coil and configured to drive the charging coil to move in the receiving space.

The driving assembly may include a motor and a slider. The motor is connected with the slider, the slider is connected with the charging coil, the motor is configured to drive the slider to slide, and the charging coil moves along with sliding of the slider.

The driving assembly may further include a lead screw. The lead screw has one end rotatably connected with the motor, and the slider is sleeved on the lead screw and provided with a first sliding portion. The charging device may further include a second sliding portion connected with the second housing. The first sliding portion cooperates with the second sliding portion and enables the slider to slide under rotation of the lead screw driven by the motor.

The second housing may include a bottom wall and a side wall that is connected with and bent relative to a periphery of the bottom wall. The bottom wall and the side wall cooperate to define the receiving space. The charging device may further include a support member connected with the bottom wall, and the second sliding portion is disposed on a side surface of the support member away from the bottom wall.

The slider may include a connecting portion and sliding blocks respectively protruding from opposite ends of the connecting portion. The connecting portion is sleeved on the lead screw. The support member defines sliding grooves on the side surface of the support member away from the bottom wall, and the sliding blocks cooperate with the sliding grooves to slide the slider.

The driving assembly may further include a support member and a first guide rod. The support member may include a bottom plate and side plates that are respectively connected with and bent relative to opposite ends of the bottom plate. The bottom plate and the side plates cooperate to define a sliding space, and the slider is received in the sliding space. The side plate defines a first through hole, and the lead screw extends through the first through hole and the slider. The side plate defines a second through hole. The slider defines a third through hole. The first guide rod is connected with the side plate and extends through the second through hole and the third through hole. The slider is slidable on the first guide rod through the third through hole.

The driving assembly may further include a connecting member. The charging coil is disposed on the connecting member. The connecting member has one end connected with the slider and the other end that is slidable relative to the support member.

The driving assembly may further include a second guide rod. The side plate defines a fourth through hole. The connecting member defines a fifth through hole. The second guide rod is connected with the side plate and extends through the fourth through hole and the fifth through hole, and the connecting member is slidable on the second guide rod through the fifth through hole.

The driving assembly may further include a gear assembly and a rack. The gear assembly has one end rotatably connected with the motor and the other end meshed with the rack, the rack is connected with the slider, the motor is configured to drive the gear assembly to rotate, the rack is configured to move along with rotation of the gear assembly, and the slider is configured to slide with movement of the rack.

The charging device may further include a holder disposed on the first housing. The charging device has a horizontal state and a vertical state. The holder and a side surface of the second housing away from the first housing cooperate to define a positioning recess when the charging device is in the vertical state. The positioning recess is configured to position the electronic device. In the horizontal state, the second housing is parallel to the first housing, and in the vertical state, the second housing is angled relative to the first housing.

The first housing defines an accommodating space. The charging device may further include a motor assembly received in the accommodating space and connected with the second housing. The motor assembly is configured to drive the second housing to rotate relative to the first housing.

The charging device may further include a processor received in the accommodating space and electrically connected with the motor assembly. The processor is configured to send a first control signal to the motor assembly to start the motor assembly, and configured to send a second control signal to the motor assembly to stop the motor assembly.

The charging device may further include a communication component received in the accommodating space and electrically connected with the processor. The communication component is configured to receive at least one of a third control signal or a model signal from a terminal device, and further configured to send at least one of the third control signal or the model signal to the processor. When the third control signal is received by the processor, the processor is configured to control the motor assembly to move according to the third control signal to enable the second housing to rotate relative to the first housing. When the model signal is received by the processor, the processor is further configured to control the driving assembly to move according to the model signal to enable the charging coil to correspond to an induction coil of the electronic device.

The processor is configured to control the motor assembly to move according to the third control signal when the charging device is in the horizontal state. The processor is configured to control the driving assembly to move according to the model signal when the charging device is in the vertical state and the electronic device abuts against the holder.

The charging device may further include a distance sensor received in the accommodating space. The distance sensor is connected with the motor assembly and electrically connected with the processor. During operation of the motor assembly, the distance sensor is configured to send a distance signal to the processor, and the processor is further configured to obtain a rotation angle of the second housing according to the distance signal. The processor is further configured to determine whether the rotation angle of the second housing is greater than or equal to a preset angle, and the processor is further configured to send the second control signal to the motor assembly to stop the motor assembly in response to the rotation angle of the second housing being greater than or equal to the preset angle.

The charging device may further include a speaker received in the accommodating space and electrically connected with the processor. The processor is further configured to send an audio signal to the speaker to make the speaker sound when the processor sends the first control signal to the motor assembly. The processor is further configured to stop sending the audio signal to the speaker when the processor sends the second control signal to the motor assembly.

The charging device may further include a first switch and a second switch received in the accommodating space. Both the first switch and the second switch are electrically connected with the processor. The first switch is configured to send a vertical signal to the processor in response to pressing of the first switch, and the processor is further configured to send the first control signal to the motor assembly according to the vertical signal, the motor assembly is configured to drive the second housing to rotate in a first direction. The second switch is configured to send a horizontal signal to the processor in response to pressing of the second switch. The processor is further configured to send a fourth control signal to the motor assembly according to the horizontal signal, the motor assembly is configured to drive the second housing to rotate in a second direction, where the first direction is opposite to the second direction.

The processor is further configured to obtain a pressing duration of the first switch according to the vertical signal and determine whether the pressing duration is less than a preset duration. The processor is configured to send the second control signal to the motor assembly in response to the pressing duration being less than the preset duration and the rotation angle of the second housing being equal to the preset angle, or the processor is configured to send the second control signal to the motor assembly in response to the pressing duration being greater than or equal to the preset duration and removal of a touch force on the first switch.

An electronic device assembly is further provided in the implementations. The electronic device assembly may include an electronic device and the charging device provided above. The electronic device is plated on the charging device for charging. The electronic device may include an induction coil and a battery. The charging coil and the induction coil cooperate to charge the battery.

Figure 2:
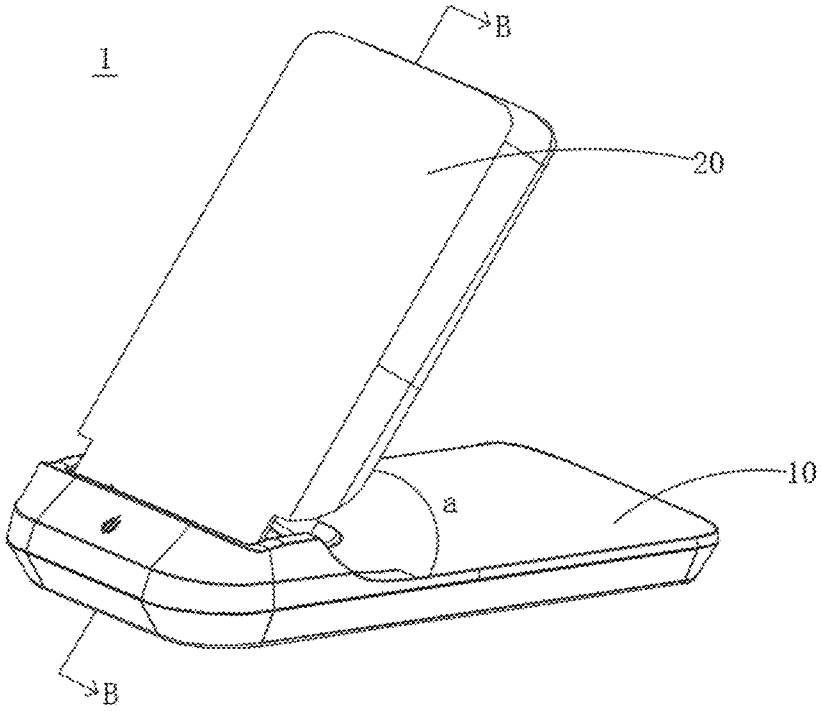
FIG. 2 is a schematic structural view of a charging device in a vertical state in an implementation of the disclosure.
Figure 3:
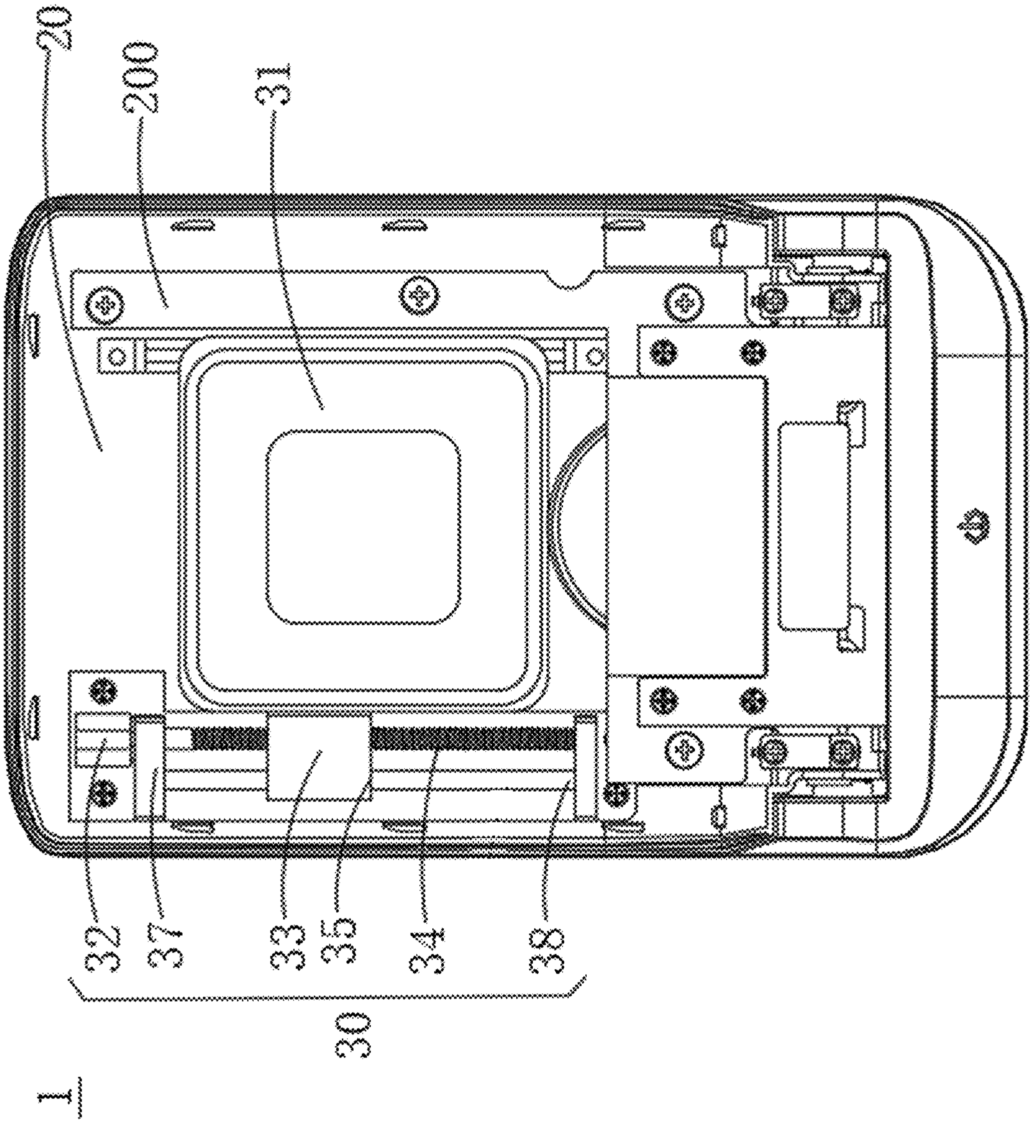
FIG. 3 is a top view of a charging device in an implementation of the disclosure, where part of a second housing is omitted.
Figure 4:
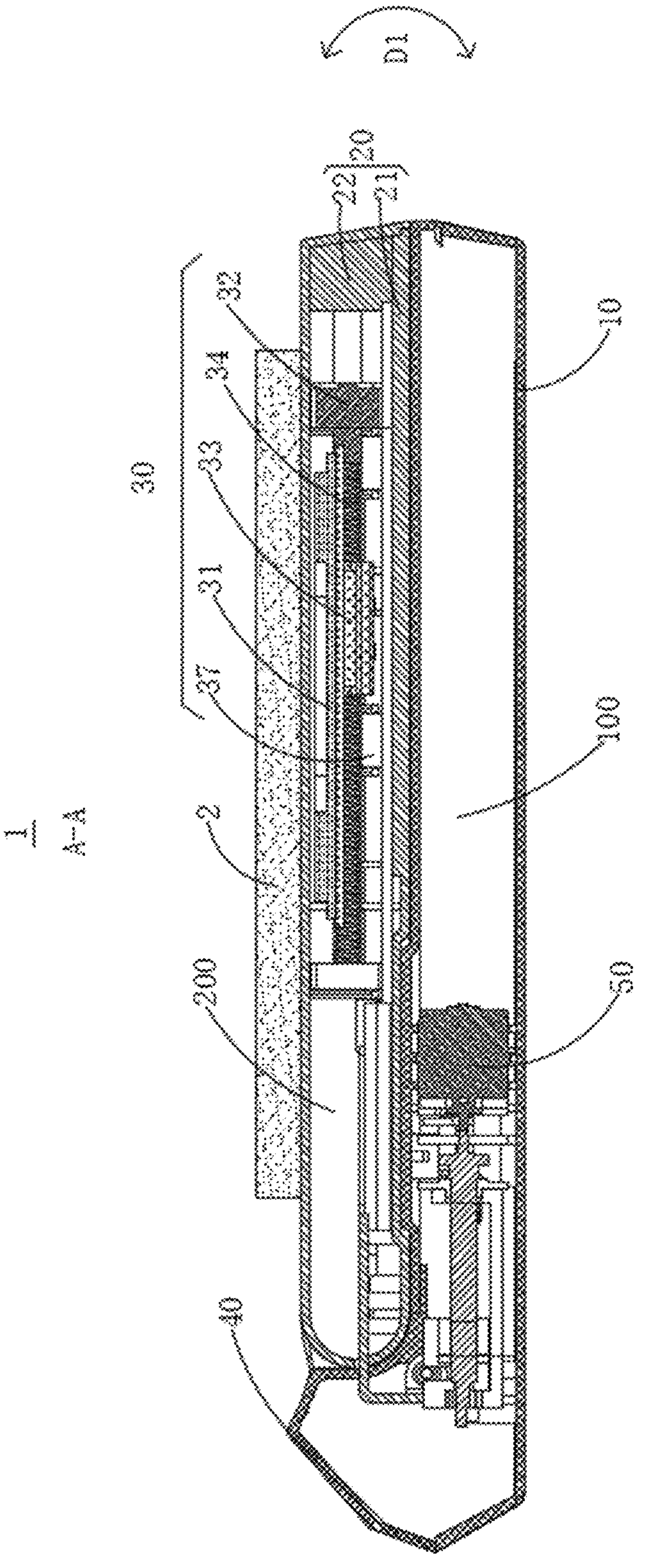
FIG. 4 is a schematic cross-sectional view of the charging device in FIG. 1 in an implementation of the disclosure, taken along line A-A.

Refer to FIGS. 1-4. FIG. 1 is a schematic structural view of a charging device in a horizontal state in an implementation of the disclosure. FIG. 2 is a schematic structural view of a charging device in a vertical state in an implementation of the disclosure. FIG. 3 is a top view of a charging device in an implementation of the disclosure, where part of a second housing is omitted. FIG. 4 is a schematic cross-sectional view of the charging device illustrated in FIG. 1 in an implementation of the disclosure, taken along line A-A. A charging device 1 is provided in the implementations. The charging device 1 may include a first housing 10, a second housing 20 defining a receiving space 200, and a driving assembly 30 and a charging coil 31. The second housing 20 is rotatably connected with the first housing 10. The second housing 20 is configured to hold an electronic device 2. The driving assembly 30 and the charging coil 31 are both received in the receiving space 200, and the driving assembly 30 is connected with the charging coil 31 and configured to drive the charging coil 31 to move in the receiving space 200.

The charging device 1 provided in the implementations is mainly configured to charge the electronic device 2. The charging device 1 may be connected with an external power supply, and serve as an intermediate medium to transfer the external electrical energy to charge the electronic device 2. Alternatively, the charging device 1 itself has a battery, and the charging device 1 can transfer the electrical energy of its own battery to charge the electronic device 2. In addition, the electronic device 2 may include but is not limited to a mobile terminal such as a mobile phone, a tablet, a laptop, a palmtop, a personal computer (PC), a personal digital assistant (PDA), a portable media player (PMP), a navigation apparatus, a wearable device, a smart bracelet, a pedometer, and a fixed terminal such as a digital television (TV) and a desktop computer. For example, the electronic device 2 is a mobile phone in the disclosure.

The charging device 1 provided in the implementation may include the first housing 10 and the second housing 20. The second housing 20 is configured to hold the electronic device 2. The first housing 10 can be regarded as a lower housing, and the second housing 20 can be regarded as an upper housing. The first housing 10 is rotatably connected with the second housing 20 to enable the second housing 20 to rotate relative to the first housing 10. That is, the first housing 10 remains stationary while the second housing 20 rotates, as illustrated by array D1 in FIG. 4. The electronic device 2 is placed on the second housing 20, and thus when the second housing 20 rotates relative to the first housing 10, the electronic device 2 also rotates together with the second housing 20.

The vertical-horizontal convertible charging device 1 is provided in the implementations, that is, the charging device 1 may have two states: a horizontal state (as illustrated in FIG. 1) and a vertical state (as illustrated in FIG. 2). In the horizontal state, the second housing 20 is parallel to the first housing 10, which can also be understood as that the second housing 20 abuts against a surface of the first housing 10. In the vertical state, the second housing 20 is angled relative to the first housing 10, which can also be understood as that the second housing 20 has rotated relative to the first housing 10, and one end of the second housing 20 has rotated away from the first housing 10, and thus the second housing 20 and the first housing 10 are no longer parallel to each other, and define a certain included angle (illustrated as angle $\alpha$ in FIG. 2). Optionally, in the vertical state, the angle defined between the second housing 20 and the first housing 10 may be greater than 0° and less than 90°, i.e., $0° < \alpha < 90°$. When the charging device 1 is in the vertical state, the electronic device 2 on the second housing 20 may also rotate together with the second housing 20, "standing" up to meet user's needs for viewing the electronic device 2 at different angles.

In addition, the charging device 1 provided in the implementations may further include the driving assembly 30 and the charging coil 31. Both the driving assembly 30 and the charging coil 31 are received in the receiving space 200 of the second housing 20. The driving assembly 30 is connected with the charging coil 31 and is configured to drive the charging coil 31 to move in the receiving space 200. The charging coil 31 in the receiving space 200 is not fixed but can be moved by the driving assembly 30. Optionally, the charging coil 31 may be a wired coil or a wireless coil. In the implementations, the charging coil 31 is illustrated as a wireless coil, so that the charging device 1 can serve as a wireless charging device 1, further enhancing the convenience of the charging device 1.

In view of above, in the charging device 1 provided in the implementations, the second housing 20 is rotatably connected with the first housing 10, and the charging coil 31 is movable in the second housing 20. As such, a position of the charging coil 31 can be adjusted due to movability of the charging coil 31. Different models of electronic devices 2 may vary in size and positions and sizes of induction coils 4 in different models of electronic devices 2 are different, and therefore, allowing the charging coil 31 to be movable ensures that the charging coil 31 can be properly positioned to face the induction coil 4, thereby adapting to different models of electronic devices 2 and improving the charging efficiency of the charging device 1. Further, when the charging device 1 is in the vertical state, the electronic device 2 may slide downwards due to gravity, leading to a change in a position of the electronic device 2. Therefore, due to the movability of the charging coil 31, the position of the charging coil 31 can be adjusted to adapt to the electronic device 2 in different states, further improving the charging efficiency of the charging device 1. A motor 32 is configured to drive the charging coil 31 and will be described in detail below.

Referring to FIG. 4 again, in the implementations, the driving assembly 30 may include the motor 32 and a slider 33. The motor 32 is connected with the slider 33. The slider 33 is connected with the charging coil 31. The motor 32 is configured to drive the slider 33 to slide, and the charging coil 31 moves along with sliding of the slider 33.

In the implementations, the driving assembly 30 mainly may include the motor 32 and the slider 33. The motor 32 is connected with the slider 33. The slider 33 is connected with the charging coil 31. The motor 32 is configured to drive the slider 33 to slide. Sliding movement of the slider 33 by the motor 32 can move the charging coil 31, so that the position of the charging coil 31 can be changed. In the implementations, the slider 33 serves as an intermediate structure, so that operation of the motor 32 can drive the charging coil 31 to move, thereby improving reliability and stability of movement of the charging coil 31.

In the disclosure, there mainly are two manners in which the slider 33 is driven by the motor 32 to slide. One is that sliding movement of the slider 33 is realized with the aid of a lead screw 34, and the other one is that sliding movement of the slider 33 is realized with the aid of a gear assembly 300. The first manner is first described below.

Figure 5:
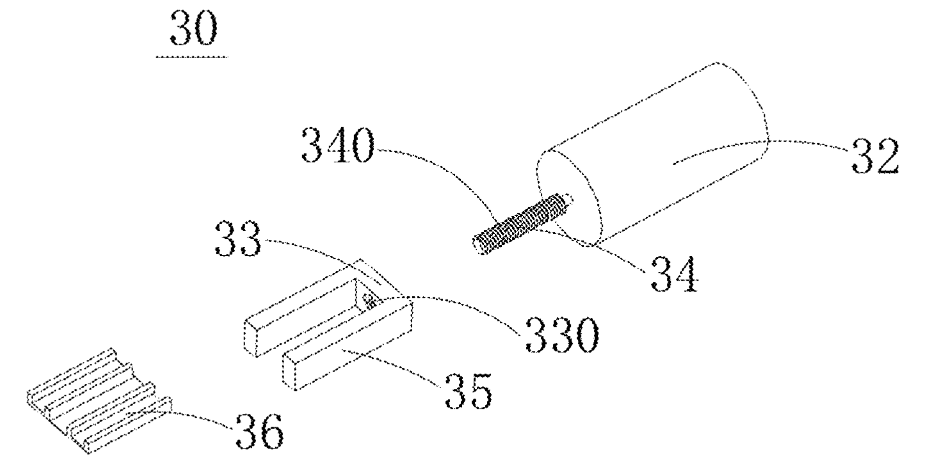
FIG. 5 is an exploded view of a driving assembly in an implementation of the disclosure.

Referring to FIG. 3 and FIG. 5 together, FIG. 5 is an exploded view of a driving assembly in an implementation of the disclosure. In the implementations, the driving assembly 30 may further include the lead screw 34. The lead screw 34 has one end rotatably connected with the motor 32. The slider 33 is sleeved on the lead screw 34 and provided with a first sliding portion 35. The charging device 1 may further include a second sliding portion 36 connected with the second housing 20. The first sliding portion 35 cooperates with the second sliding portion 36 and enables the slider 33 to slide under rotation of the lead screw 34 driven by the motor 32.

In a first manner provided in the disclosure in which sliding movement is realized with the aid of the lead screw 34, the lead screw 34 is further disposed in the driving assembly 30. The lead screw 34 has one end rotatably connected with the motor 32. The slider 33 is sleeved on the lead screw 34. The motor 32 in operation may drive the lead screw 34 to rotate together, thereby causing the slider 33 to slide. In addition, in order to slide rather than rotate the slider 33, in the implementations, the slider 33 is provided with the first sliding portion 35, and the first sliding portion 35 cooperates with the second sliding portion 36 connected with the second housing 20, so that rotation movement of the lead screw 34 can be converted into sliding movement of the slider 33. It can also be understood that the first sliding portion 35 cooperates with the second sliding portion 36 to achieve a guiding function, so that a rotation force of the lead screw 34 is converted into a sliding force, thereby driving the slider 33 to slide.

Optionally, the slider 33 may define a threaded hole 330. The lead screw 34 may have threads 340 on a surface of the lead screw 34. The slider 33 is threadedly connected with the lead screw 34 through the threaded hole 330 and the threads 340. Furthermore, the threaded connection between the lead screw 34 and the slider 33 has a certain self-locking property, and thus after the second housing 20 is rotated, a weight of the charging coil 31 or other members cannot reverse the motor 32, such that the second housing 20 does not fall down, thereby enhancing the safety of the charging device 1.

In the disclosure, there are two manners in which the first sliding portion 35 cooperates with the second sliding portion 36 to slide the slider 33. One is that a sliding block 332 cooperates with a sliding groove 371 to guide sliding movement of the slider 33, and the other one is that a guide rod guides sliding movement of the slider 33.

Figure 6:
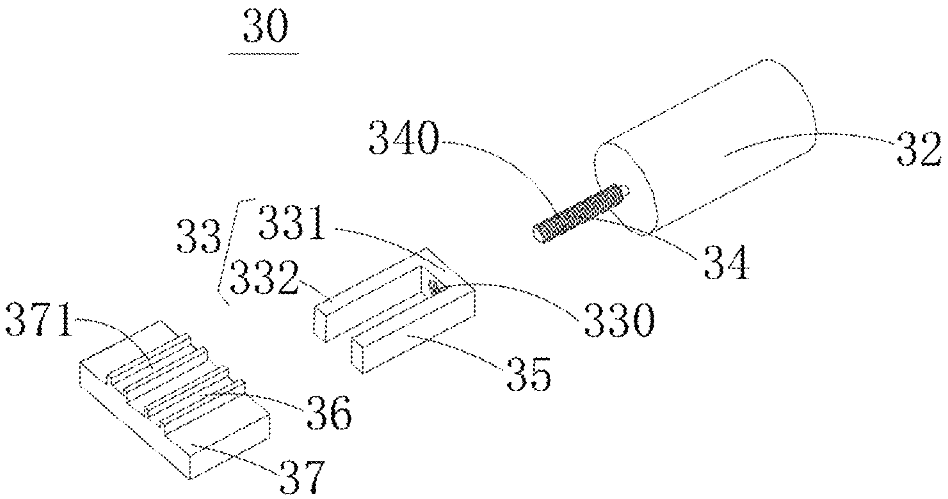
FIG. 6 is an exploded view of a driving assembly in another implementation of the disclosure.

Referring to FIG. 4 and FIG. 6, FIG. 6 is an exploded view of a driving assembly in another implementation of the disclosure. In the implementations, the second housing 20 may include a bottom wall 21 and a side wall 22 that is connected with and bent relative to a periphery of the bottom wall 21. The bottom wall 21 and the side wall 22 cooperate to define the receiving space 200. The charging device 1 may further include a support member 37 connected with the bottom wall 21, and the second sliding portion 36 is disposed on a side surface of the support member 37 away from the bottom wall 21.

In a first manner provided in the disclosure in which the sliding block 332 cooperates with the sliding groove 371 to realize guiding, to realize the above cooperation, in the implementations, the support member 37 is further provided on the bottom wall 21 of the second housing 20, and the second sliding portion 36 is disposed on the side surface of the support member 37 away from the bottom wall 21. It can also be understood that the support member 37 is separated from the second housing 20. The second sliding portion 36 is first disposed on the support member 37, and then the support member 37 is placed on the second housing 20, which can reduce the difficulty of manufacturing the second housing 20.

Referring to FIG. 6 again, in the implementations, the slider 33 may include a connecting portion 331 and sliding blocks 332 respectively protruding from opposite ends of the connecting portion 331. The connecting portion 331 is sleeved on the lead screw 34. The support member 37 defines a sliding groove 371 on the side surface of the support member 37 away from the bottom wall 21. The sliding block 332 cooperates with the sliding grooves 371 to slide the slider 33.

In addition to the support member 37, the slider 33 may further include the connecting portion 331 and the sliding blocks 332 respectively protruding from opposite side surfaces of the connecting portion 331. In the implementations, the slider 33 may be divided into two parts, where the connecting portion 331 is sleeved on the lead screw 34 and the sliding blocks 332 serve as the first sliding portion 35. The support member 37 defines the sliding groove 371 on the side surface of the support member 37 away from the bottom wall 21, and the sliding groove 371 serves as the second sliding portion 36. In the implementations, the sliding blocks 332 cooperate with the sliding groove 371, so that rotation movement of the slider 33 can be converted into sliding movement, and the sliding blocks 332 can slide in the sliding groove 371 in a directed direction.

Figure 7:
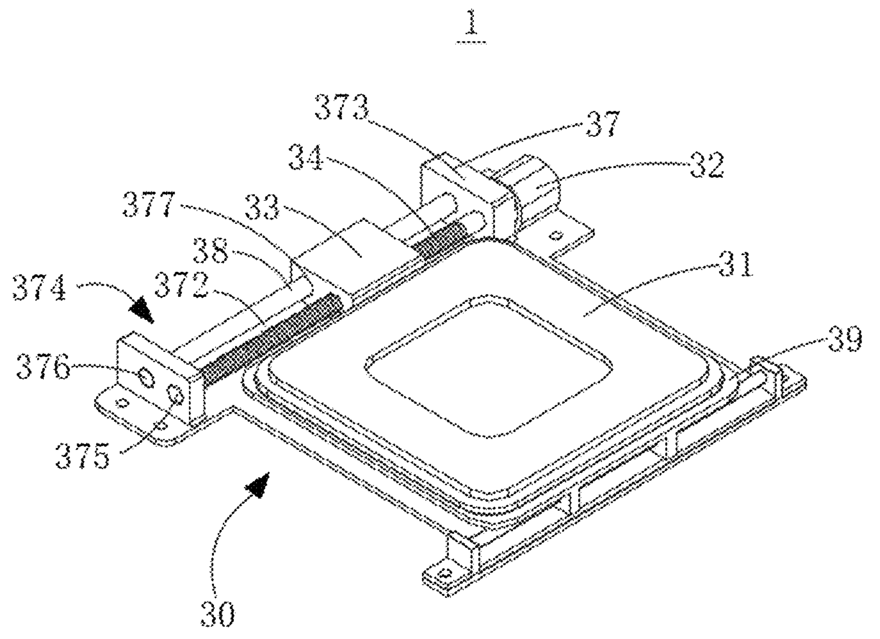
FIG. 7 is a schematic perspective structural view of a driving assembly and a charging coil in an implementation of the disclosure.
Figure 8:
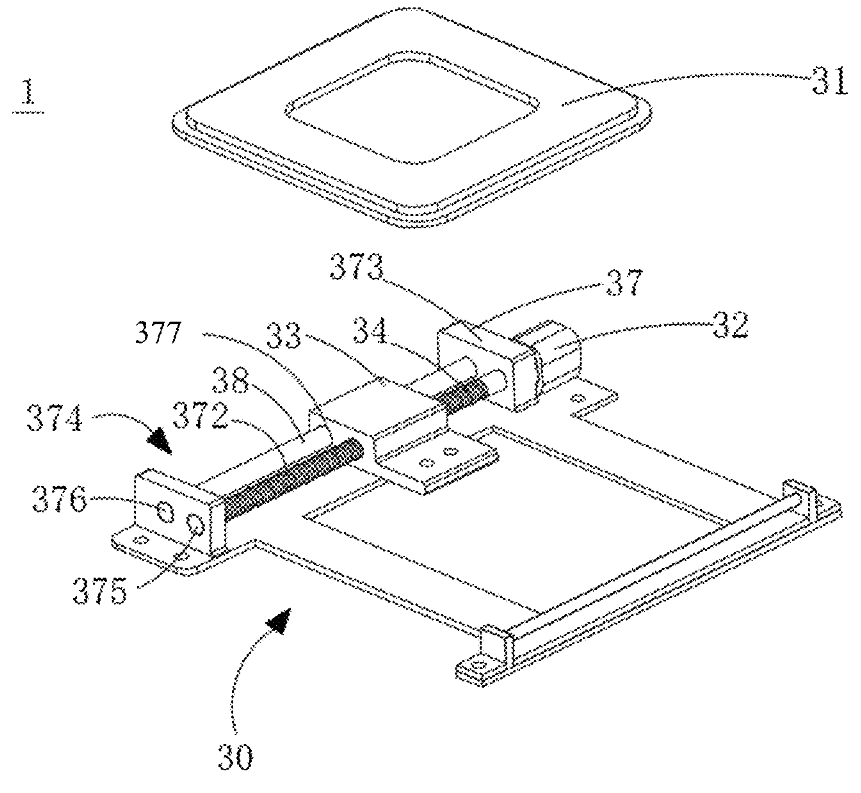
FIG. 8 is an exploded view of the driving assembly and the charging coil in FIG. 7.

Referring to FIG. 7 and FIG. 8, FIG. 7 is a schematic perspective structural view of a driving assembly and a charging coil in an implementation of the disclosure, and FIG. 8 is an exploded view of the driving assembly and the charging coil in FIG. 7. In the implementations, the driving assembly 30 may further include the support member 37 and the first guide rod 38. The support member 37 may include a bottom plate 372 and side plates 373 that are respectively connected with and bent relative to opposite ends of the bottom plate 372. The bottom plate 372 and the side plates 373 cooperate to define a sliding space 374. The slider 33 is received in the sliding space 374. The side plate 373 defines a first through hole 375. The lead screw 34 extends through the first through hole 375 and the slider 33. The side plate 373 defines a second through hole 376. The slider 33 defines a third through hole 377. The first guide rod 38 is connected with the side plates 373 and extends through the second through hole 376 and the third through hole 377. The slider 33 is slidable on the first guide rod 38 through the third through hole 377.

In a second manner provided in the disclosure in which the sliding movement is realized with the aid of the guiding of the guide rod, the support member 37 and the first guide rod 38 may be further provided. In the implementations, the support member 37 may include the bottom plate 372 and the side plates 373. The bottom plate 372 and the side plates 373 may cooperate to define the sliding space 374, so that the slider 33 can slide in the sliding space 374. Additionally, the side plate 373 defines the first through hole 375. The lead screw 34 extends through the first through hole 375 and the threaded hole 330 of the slider 33, so that the lead screw 34 is mounted at the side plate 373. The side plate 373 further defines the second through hole 376. The slider 33 defines the third through hole 377. The first guide rod 38 extends through the second through hole 376 and the third through hole 377 and is connected with the side plate 373. In this way, rotation movement of the slider 33 can be converted into sliding movement with the aid of the guiding of the first guide rod 38, and thus the slider 33 slides in an axial direction of the lead screw 34.

Optionally, the motor 32 may be fixedly connected with the support member 37 via screws, and the first guide rod 38 may be fixedly connected with the threaded hole at one end of the support member 37 via the threads at one end of the first guide rod 38. Optionally, a bearing may also be provided in the first through hole 375, and the bearing is sleeved on one end of the lead screw 34. The bearing may cooperate with the lead screw 34 and the support member 37 to improve rotation performance of the lead screw 34.

Figure 9:
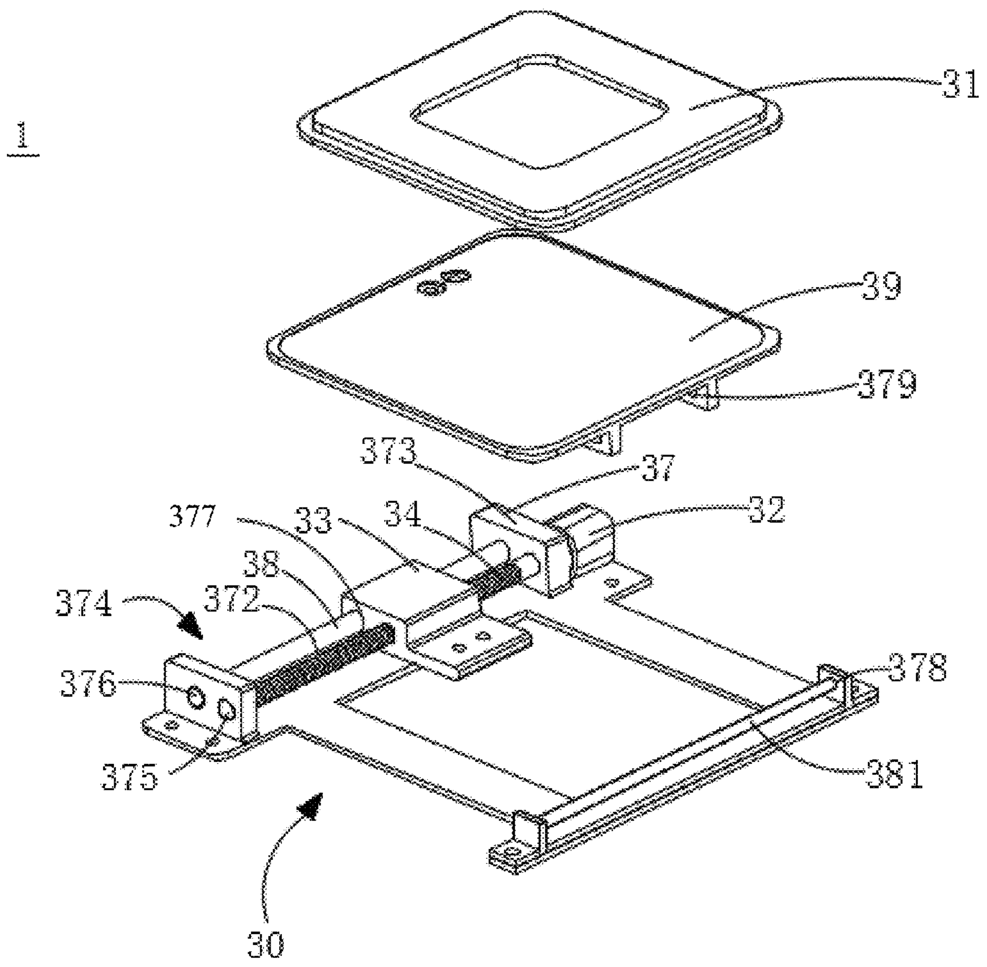
FIG. 9 is an exploded view of the driving assembly and the charging coil in FIG. 7 in another implementation of the disclosure.

Referring to FIG. 9, FIG. 9 is an exploded view of the driving assembly and the charging coil in FIG. 7 in another implementation of the disclosure. In the implementations, the driving assembly 30 may further include a connecting member 39. The charging coil 31 is disposed on the connecting member 39. The connecting member 39 has one end connected with the slider 33 and the other end that is slidable relative to the support member 37.

In the implementations, the charging coil 31 is not directly connected with the slider 33. The connecting member 39 can be further provided, and the charging coil 31 can be mounted at the connecting member 39. One end of the connecting member 39 is connected with the slider 33, so that the slider 33 can be indirectly connected with the charging coil 31 via the connecting member 39. In this way, the slider 33 has a simply structure and stability of connection of the charging coil 31 is improved. The other end of the connecting member 39 is slidable relative to the support member 37, thereby enhancing sliding efficiency and sliding stability of the connecting member 39.

Referring to FIG. 9 again, in the implementation, the driving assembly 30 may further include a second guide rod 381, the side plate 373 further defines a fourth through hole 378, and the connecting member 39 defines a fifth through hole 379. The second guide rod 381 is connected with the side plate 373 and extends through the fourth through hole 378 and the fifth through hole 379, and the connecting member 39 is slidable on the second guide rod 381 through the fifth through hole 379.

In order to allow the other end of the connecting member 39 to be slidable relative to the support member 37, the second guide rod 381 is further provided in the implementations. The side plate 373 defines the fourth through hole 378. The connecting member 39 defines the fifth through hole 379, and the second guide rod 381 extends through the fourth through hole 378 and the fifth through hole 379 to be connected with the side plate 373. In this way, when the slider 33 slides along the first guide rod 38, the one end of the connecting member 39 is driven by the slider 33 to slide together, and the other end of the connecting member 39 slides along the second guide rod 381.

Figure 10:
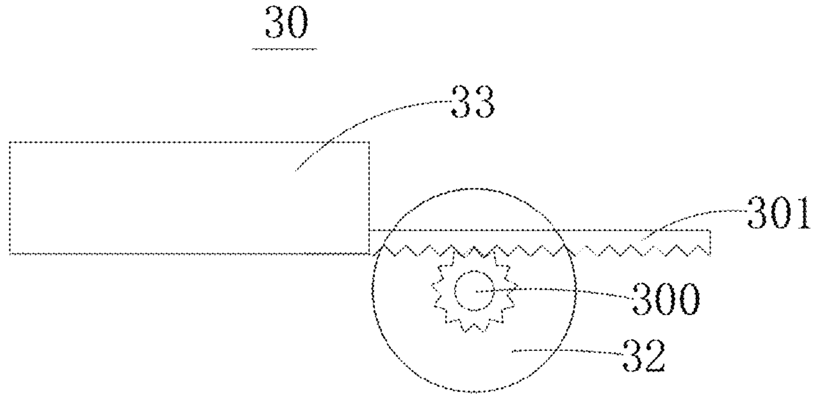
FIG. 10 is a schematic structural view of a driving assembly in another implementation of the disclosure.

Referring to FIG. 10, FIG. 10 is a schematic structural view of a driving assembly in another implementation of the disclosure. In the implementations, the driving assembly 30 may further include a gear assembly 300 and a rack 301. The gear assembly 300 has one end rotatably connected with the motor 32 and the other end meshed with the rack 301, the rack 301 is connected with the slider 33, the motor 32 is configured to drive the gear assembly 300 to rotate, the rack 301 is configured to move along with rotation of the gear assembly 300, and the slider 33 is configured to slide with movement of the rack 301.

The above describes the first manner provided in the disclosure in which the sliding movement is realized with the aid of the lead screw 34. In the implementations, another manner in which the sliding movement is realized with the aid of the gear assembly 300 is provided in the disclosure. The gear assembly 300 and the rack 301 are further provided, one end of the gear assembly 300 is connected with the motor 32, the other end of the gear assembly 300 is meshed with the rack 301, and the rack 301 is connected with the slider 33. In this way, the gear assembly 300 is meshed with the rack 301, and thus when the motor 32 drives the gear assembly 300 to rotate, rotation of the gear assembly 300 can be converted into movement of the rack 301. The movement of the rack 301 drives the slider 33 to slide. In the implementations, the gear assembly 300 and the rack 301 cooperate to convert rotation movement into sliding movement, so that driving components have simple structure. Additionally, a speed of the slider 33 may be adjusted by adjusting the number (quantity) and size of the teeth in the gear assembly 300. Optionally, the gear assembly 300 may include one or more gears rotatably connected with each other.

Figure 11:
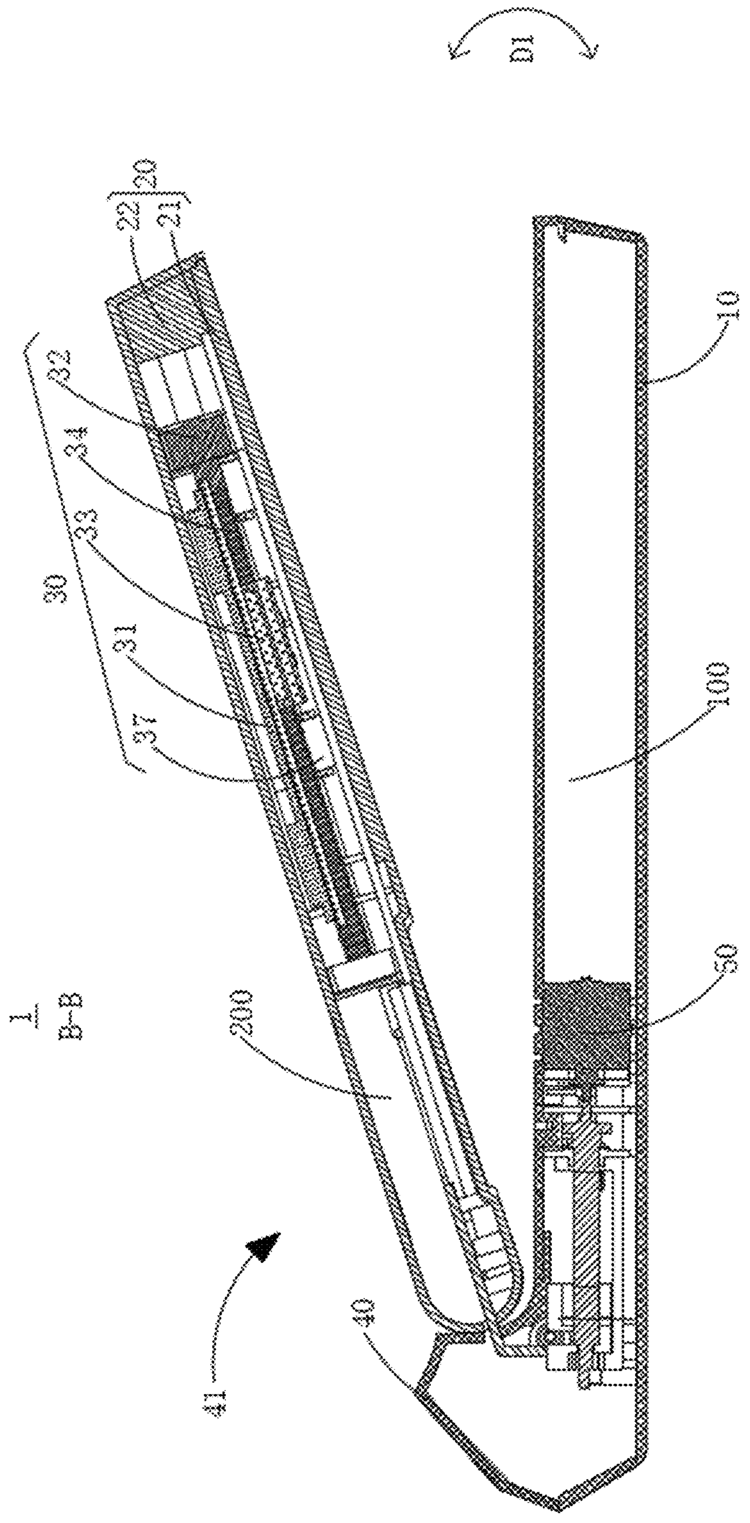
FIG. 11 is a schematic cross-sectional view of the charging device in FIG. 2 in an implementation of the disclosure, taken along line B-B.

Referring to FIG. 11, FIG. 11 is a schematic cross-sectional view of the charging device in FIG. 2 in an implementation of the disclosure, taken along line B-B. In the implementations, the charging device 1 may further include a holder 40 disposed on the first housing 10. The charging device 1 has a horizontal state and a vertical state. The holder 40 and a side surface of the second housing 20 away from the first housing 10 cooperate to define a positioning recess 41 when the charging device 1 is in the vertical state. The positioning recess 41 is configured to position the electronic device 2. In the horizontal state, the second housing 20 is parallel to the first housing 10, and in the vertical state, the second housing 20 is angled relative to the first housing 10.

During switching of the charging device 1 from the horizontal state to the vertical state, that is, during rotation of the second housing 20 relative to the first housing 10, the electronic device 2 placed on the second housing 20 may also rotate, resulting in that the electronic device 2 may slide downwards due to its own gravity. Thus, the holder 40 is further provided on the first housing 10. When the electronic device 2 is in the vertical state, the holder 40 and the side surface of the second housing 20 away from the first housing 10 cooperate to define the positioning recess 41. The holder 40 may be configured to support one end of the electronic device 2 to prevent the electronic device 2 from sliding down.

Optionally, the holder 40 and the first housing 10 may be integrally formed. However, in order to distinguish their structures better, the holder 40 and the first housing 10 are divided into two parts.

Optionally, when the charging device 1 is in the horizontal state, a side surface of the holder 40 away from the first housing 10 is substantially flush with a side surface of the second housing 20 away from the first housing 10. Therefore, the holder 40 does not exceed the second housing 20 when the charging device 1 is in the horizontal state, which improves a flatness of the charging device 1 and makes it more convenient to place the electronic device 2 on the charging device 1 as needed.

Referring to FIG. 4 and FIG. 11, in the implementations, the first housing 10 defines an accommodating space 100. The charging device 1 may further include a motor assembly 50 received in the accommodating space 100 and connected with the second housing 20. The motor assembly 50 is configured to drive the second housing 20 to rotate relative to the first housing 10.

In the implementations, in order to enable the second housing 20 to be rotatable relative to the first housing 10, the motor assembly 50 can be further provided. The motor assembly 50 is received in the accommodating space 100 of the first housing 10 and connected with the second housing 20. Therefore, when the motor assembly 50 starts operation, the motor assembly 50 can drive the second housing 20 to rotate relative to the first housing 10. As for the specific structure of the motor assembly 50, any structure that can drive the second housing 20 to rotate relative to the first housing 10 should be within the protection scope of the disclosure, which will not be described herein.

In addition, in the disclosure, the charging device may further include a processor 60 received in the accommodating space 100. The processor 60 is electrically connected with the motor assembly 50, configured to send a first control signal to the motor assembly 50 to start the motor assembly 50, and further configured to send a second control signal to the motor assembly 50 to stop the motor assembly 50. The processor 60 can send different control signals to control specific operations of the motor assembly 50, so that the motor assembly 50 can be precisely controlled. The following will describe specifically several implementations in which operation of the motor assembly 50 is controlled through cooperation between the processor 60 and other electronic structural members.

Figure 12:
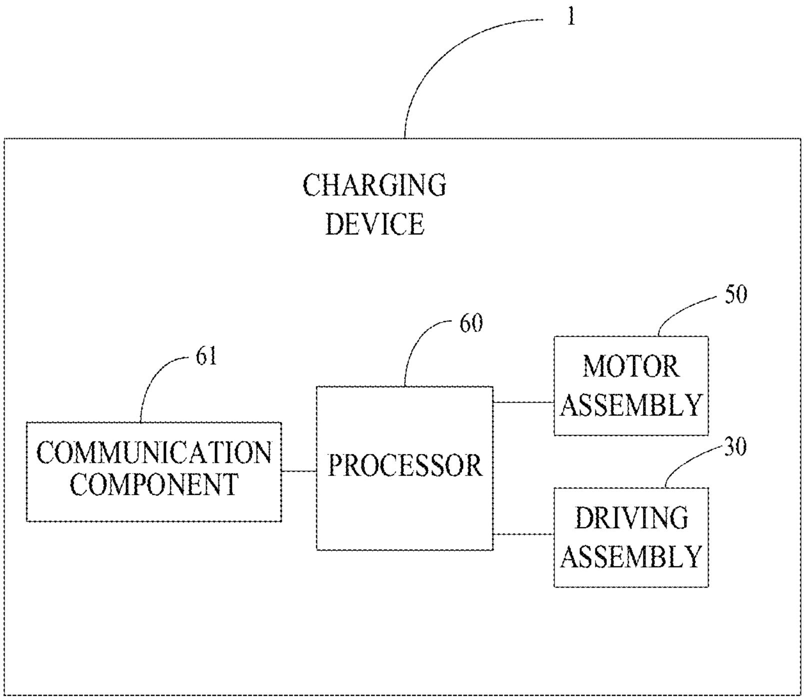
FIG. 12 illustrates a schematic structural diagram of electronic parts of a charging device in an implementation of the disclosure.

Referring to FIG. 12, FIG. 12 illustrates a schematic structural diagram of electronic parts of a charging device in an implementation of the disclosure. In the implementations, the charging device 1 may further include a communication component 61 received in the accommodating space 100. The communication component 61 is configured to receive at least one of a third control signal or a model signal from a terminal device, and further configured to send at least one of the third control signal or the model signal to the processor 60. When the third control signal is received by the processor 60, the processor 60 is configured to control the motor assembly 50 to move according to the third control signal to enable the second housing 20 to rotate relative to the first housing 10. When the model signal is received by the processor 60, the processor 60 is further configured to control the driving assembly 30 to move according to the model signal to enable the charging coil 31 to correspond to an induction coil 4 of the electronic device 2.

In addition to the above-mentioned mechanical structural members of the charging device 1, in the implementations, the charging device 1 may also include other structural members with electrical control functions, such as the communication component 61. The processor 60 is electrically connected with the communication component 61. The communication component 61 is configured to receive the third control signal and the model signal from the terminal device. The terminal device may be external devices such as mobile phones, computers, servers, etc. The model signal may include dimensions of these devices, dimensions of internal structural members, and positions of the internal structural members such as a position of the induction coil 4. These devices each may send the third control signal and the model signal to the communication component 61. The communication component 61 subsequently sends the third control signal and the model signal to the processor 60, and the processor 60 can control different members to achieve different functions according to the third control signal and the model signal. For example, the processor 60 can control the motor assembly 50 to operate according to the third control signal, to cause the second housing 20 to rotate relative to the first housing 10, and thus the charging device 1 can switch between the horizontal state and vertical state. The processor 60 can also control the driving assembly 30 to move according to the model signal, to cause the charging coil 31 to move to a position facing the induction coil 4 of the electronic device 2, thereby improving the charging efficiency. Therefore, with the aid of the cooperation of the processor 60, the communication component 61, and the external terminals, rotation of the charging device 1 can be controlled and position of the charging coil 31 can be adjusted.

Optionally, in the implementations, the processor 60 is configured to control the motor assembly 50 to move according to the third control signal when the charging device 1 is in the horizontal state. The processor 60 is configured to control the driving assembly 30 to move according to the model signal when the charging device 1 is in the vertical state and the electronic device 2 abuts against the holder 40.

As described above, the processor 60 is configured to control movements of members of the charging device 1 according to the third control signal and the model signal. The communication component 61 may receive the third control signal or the model signal. Alternatively, the communication component 61 may receive both the third control signal and the model signal. However, the processor 60 may not process both the third control signal and the model signal simultaneously; instead, the processor 60 may process the third control signal and the model signal in different sequences in different states. The processor 60 may process both the third control signal and the model signal simultaneously. For example, when the charging device 1 performs charging in the horizontal state, the processor 60 may only process the model signal to move the induction coil 4 for alignment. When the charging device 1 performs charging in the vertical state, the processor 60 may first control the second housing 20 to rotate according to the third control signal, making the charging device 1 and the electronic device 2 stand up, and at this point, the electronic device 2 may slide down to a position where the holder 40 is located due to gravity. Therefore, the position of the electronic device 2 when the charging device 1 is in the vertical state is different from the position of the electronic device 2 when the charging device 1 is in the horizontal state. In the implementations, it is possible to process the model signal after the electronic device 2 slides down. That is, when the charging device 1 reaches the vertical state and the electronic device 2 contacts the holder 40, the processor 60 then controls the driving assembly 30 to operate according to the model signal, thereby improving a precision of positioning the charging coil 31.

Figure 13:
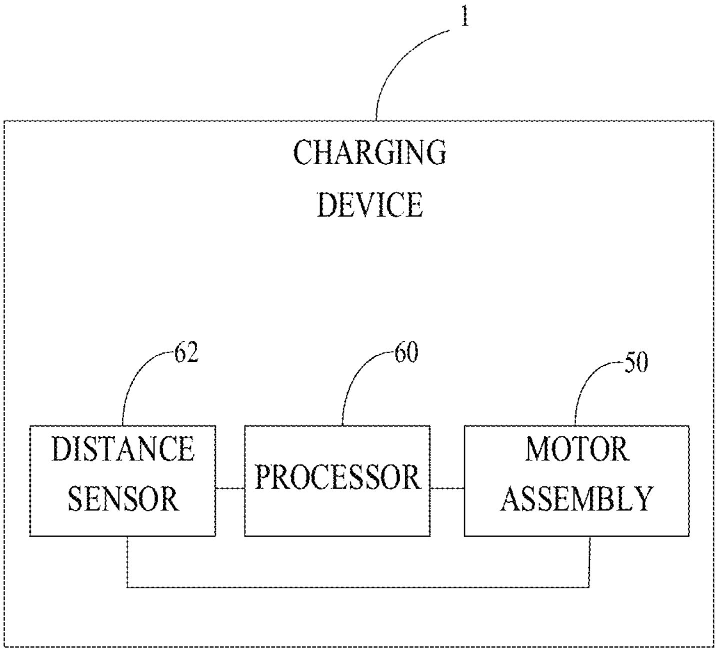
FIG. 13 illustrates a schematic structural diagram of electronic parts of a charging device in another implementation of the disclosure.

Referring to FIG. 13, FIG. 13 illustrates a schematic structural diagram of electronic parts of a charging device in another implementation of the disclosure. In the implementations, the charging device 1 may further include a distance sensor 62 received in the accommodating space 100. The distance sensor 62 is connected with the motor assembly 50 and electrically connected with the processor 60. The processor 60 is further configured to send the first control signal to the motor assembly 50 to start the motor assembly 50. During operation of the motor assembly 50, the distance sensor 62 is configured to send a distance signal to the processor 60, and the processor 60 is further configured to obtain a rotation angle of the second housing 20 according to the distance signal. The processor 60 is further configured to determine whether the rotation angle of the second housing 20 is greater than or equal to a preset angle. The processor 60 is further configured to send the second control signal to the motor assembly 50 to stop the motor assembly 50 in response to the rotation angle of the second housing 20 being greater than or equal to the preset angle.

In addition to the processor 60 and the communication component 61, in the implementations, the distance sensor 62 is further provided. The distance sensor 62 is received in the accommodating space 100, connected with the motor assembly 50, and electrically connected with the processor 60. The processor 60 is further configured to send the first control signal to the motor assembly 50 to start the motor assembly 50. During operation of the motor assembly 50, the distance sensor 62 is configured to detect a displacement distance of at least a portion of the motor assembly 50 to obtain a distance signal, then the distance sensor 62 sends the distance signal to the processor 60, and the processor 60 can obtain the rotation angle of the second housing 20 relative to the first housing 10 according to the distance signal.

In addition, the processor 60 can also determine a relationship between the rotation angle of the second housing 20 and the preset angle. The preset angle may be pre-stored in the charging device 1 or obtained by the charging device 1 from the outside in real time. The preset angle can be understood as a maximum rotation angle of the second housing 20 allowed by the charging device 1 or a rotation angle of the second housing 20 expected by the user.

When the rotation angle of the second housing 20 is greater than or equal to the preset angle, it means that the second housing 20 is rotated to an allowed maximum angle and is not expected to further rotate. Therefore, the processor 60 is further configured to send the second control signal to the motor assembly 50 to stop the motor assembly 50, thereby stopping rotation of the second housing 20, so that the charging device 1 is finally in the vertical state.

Figure 14:
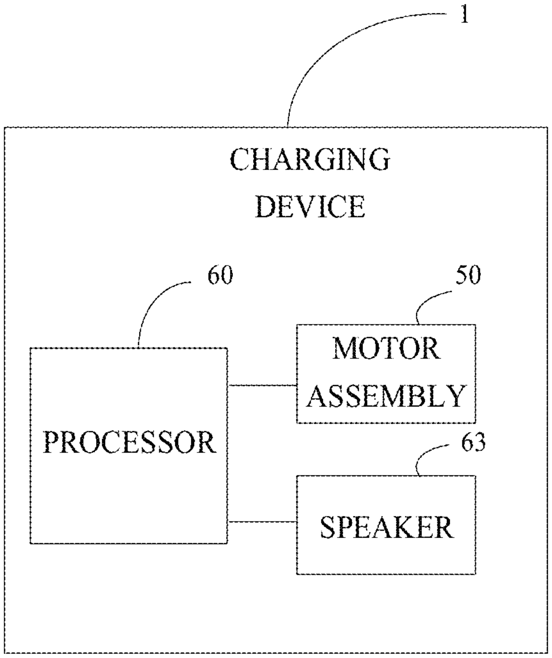
FIG. 14 illustrates a schematic structural diagram of electronic parts of a charging device in yet another implementation of the disclosure.

Referring to FIG. 14 together, FIG. 14 is a schematic structural view of an electronic structure of the charging device in yet another implementation of the disclosure. In the implementations, the charging device 1 may further include a speaker 63 received in the accommodating space 100 and electrically connected with the processor 60. The processor 60 is further configured to send an audio signal to the speaker 63 to make the speaker 63 sound when the processor 60 sends the first control signal to the motor assembly 50. The processor 60 is further configured to stop sending the audio signal to the speaker 63 when the processor 60 sends the second control signal to the motor assembly 50.

In the implementation, the speaker 63 is provided in the accommodating space 100 and is electrically connected with the processor 60. When the processor 60 sends the first control signal to the motor assembly 50, the motor assembly 50 starts operation, and at this point, the processor 60 can send the audio signal to the speaker 63 to make the speaker 63 sound. The motor assembly 50 may produce slight noise during operation. Sound of the speaker 63 can be used to make the noise be not heard, which improves user experience in combination with movement of the charging device 1. In addition, when the processor 60 sends the second control signal to the motor assembly 50 to stop the motor assembly 50, the motor assembly 50 does not sound, and at this point, the processor 60 can stop sending the audio signal to the speaker 63 to make the speaker 63 not sound. Moreover, a time point at which the charging device 1 starts operation and a time point at which the charging device 1 stops operation can also be known by a user according to a time point at which the speaker 63 sounds. Optionally, the first housing 10 defines multiple speaker holes to facilitate transmission of the sound emitted by the speaker 63 to the outside of the charging device 1.

Figure 15:
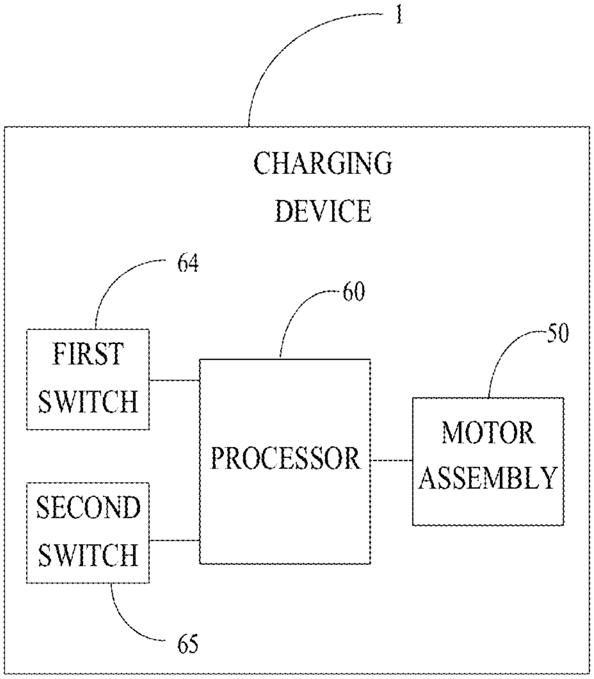
FIG. 15 illustrates a schematic structural diagram of electronic parts of a charging device in yet another implementation of the disclosure.

Referring to FIG. 15 together, FIG. 15 is a schematic structural view of an electronic structure of the charging device in yet another implementation of the disclosure. In the implementations, the charging device 1 may further include a first switch 64 and a second switch 65 received in the accommodating space 100, and both the first switch 64 and the second switch 65 are electrically connected with the processor 60.

The first switch 64 is configured to send a vertical signal to the processor 60 in response to pressing of the first switch 64, and the processor 60 is further configured to send the first control signal to the motor assembly 50 according to the vertical signal, the motor assembly 50 is configured to drive the second housing 20 to rotate in a first direction. The second switch 65 is configured to send a horizontal signal to the processor 60 in response to pressing of the second switch 65, and the processor 60 is further configured to send a fourth control signal to the motor assembly 50 according to the horizontal signal, the motor assembly 50 is configured to drive the second housing 20 to rotate in a second direction, where the first direction is opposite to the second direction.

In the implementation, the first switch 64 and the second switch 65 are provided in the accommodating space 100, connected with the first housing 10, and are electrically connected with the processor 60. The first switch 64 and the second switch 65 are structural members that are configured to control a time when the charging device 1 starts operation. Both the first switch 64 and the second switch 65 can be pressed. The first switch 64 can send the vertical signal to the processor 60 in response to pressing of the first switch 64, and the processor 60 can send the first control signal to the motor assembly 50 according to the vertical signal, thereby starting the motor assembly 50, so that the motor assembly 50 drives the second housing 20 to rotate in the first direction. It can also be understood as that when the first switch 64 is pressed, the motor assembly 50 starts operation to switch the charging device 1 from the horizontal state to the vertical state. The second switch 65 can send the horizontal signal to the processor 60 in response to pressing of the second switch 65, and the processor 60 is further configured to send the fourth control signal to the motor assembly 50 according to the horizontal signal, thereby restarting the motor assembly 50, so that the motor 32 drives the second housing 20 to rotate in the second direction. It can also be understood as that when the second switch 65 is pressed, the motor assembly 50 starts operation to switch the charging device 1 from the vertical state to the horizontal state.

To sum up, the first switch 64 controls the charging device 1 to switch from the horizontal state to the vertical state. The second switch 65 controls the charging device 1 to switch from the vertical state to the horizontal state. The state of the charging device 1 can be controlled by pressing of the two switches, which improves operation convenience.

In addition, in the implementations, the processor 60 is further configured to obtain a pressing duration of the first switch 64 according to the vertical signal and determine whether the pressing duration is less than a preset duration. The processor 60 is configured to send the second control signal to the motor assembly 50 in response to the pressing duration being less than the preset duration and the rotation angle of the second housing 20 being equal to the preset angle, or the processor 60 is configured to send the second control signal to the motor assembly 50 in response to the pressing duration being greater than or equal to the preset duration and removal of a touch force on the first switch 64.

In the case where the first switch 64 is pressed, that is, during switching of the charging device 1 from the horizontal state to the vertical state, the second housing 20 cannot always rotate relative to the first housing 10, and thus the motor assembly 50 needs to be stopped after the second housing 20 rotates to a certain angle, thereby stopping rotation of the second housing 20. In the implementations, the processor 60 further can obtain the pressing duration of the first switch 64 according to the vertical signal, and determine a relationship between the pressing duration and the preset duration. The preset duration may be pre-stored in the charging device 1 or obtained by the charging device 1 from the outside in real time.

In the implementation, two control modes are provided according to the relationship between the pressing duration and the preset duration. In one control mode, the processor 60 sends the second control signal to the motor assembly 50 to stop the motor assembly 50 in response to the pressing duration being less than the preset duration and the rotation angle of the second housing 20 being equal to the preset angle. It can also be understood as that when the second housing 20 rotates to a maximum angle, the processor 60 can control the motor assembly 50 to stop operation. In the other control mode, the processor 60 can send the second control signal to the motor assembly 50 to stop the motor assembly 50 in response to the pressing duration being greater than or equal to the preset duration and removal of the touch force on the first switch 64. It can also be understood as that in the case where the pressing duration of the first switch 64 is greater than the preset duration, at any time a pressing force of the user is removed, the motor assembly 50 can be controlled to stop operation, so that the second housing 20 can stop rotation at any position.

Figure 16:
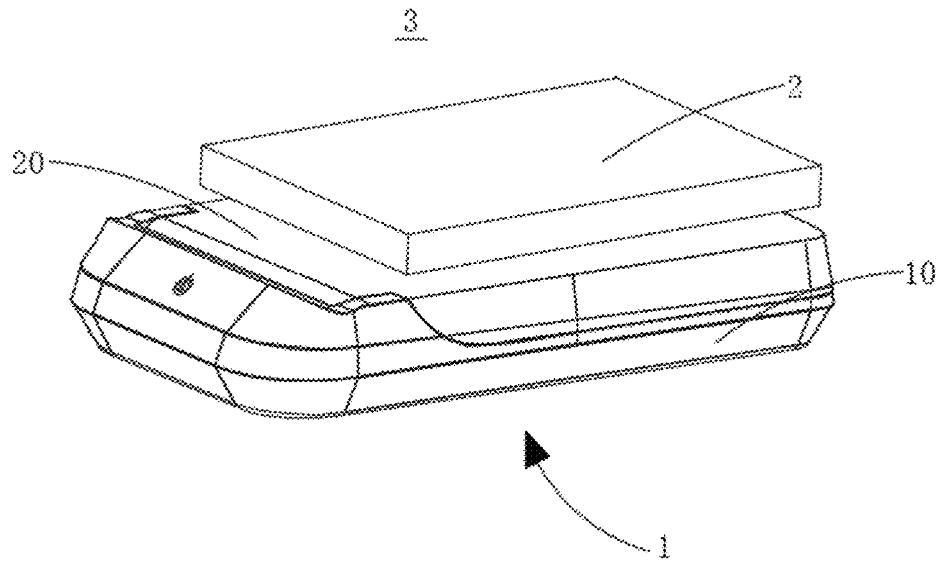
FIG. 16 is a schematic perspective structural view of an electronic device assembly in an implementation of the disclosure.
Figure 17:
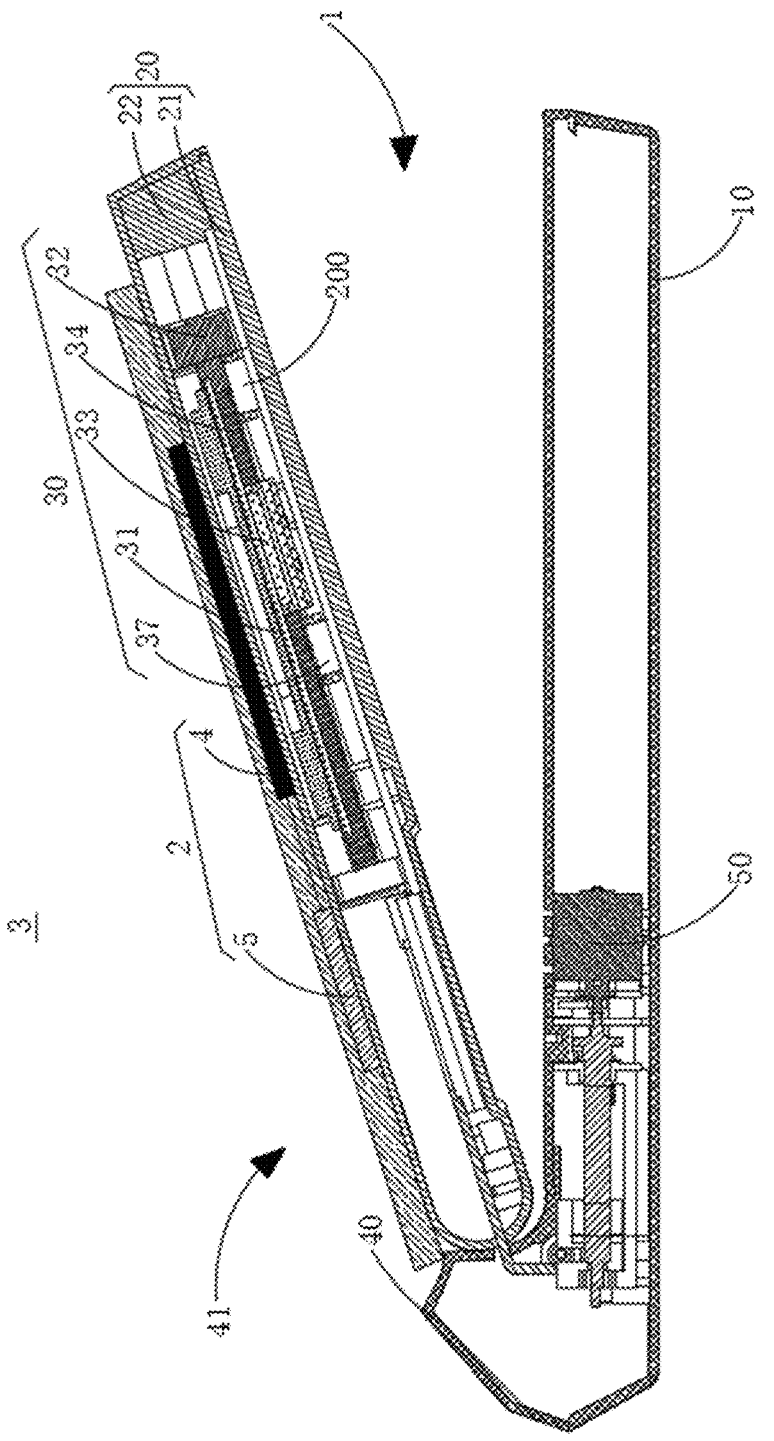
FIG. 17 is a schematic cross-sectional view of an electronic device assembly in an implementation of the disclosure.

Referring to FIG. 16 and FIG. 17, FIG. 16 is a schematic perspective structural view of an electronic device assembly in an implementation of the disclosure, and FIG. 17 is a schematic cross-sectional view of an electronic device assembly in an implementation of the disclosure. An electronic device assembly 3 is provided in the implementations. The electronic device assembly 3 may include an electronic device 2 and the charging device 1 provided in the implementations of the disclosure. The electronic device 2 is placed on the charging device 1 for charging. The electronic device 2 may include an induction coil 4 and a battery 5. The charging coil 31 and the induction coil 4 cooperate to charge the battery 5.

In addition to the specific structure of the charging device 1, the electronic device assembly 3 with the charging device 1 is also provided in the disclosure. In the implementations, the electronic device assembly 3 may include the electronic device 2 and the charging device 1 provided in the above implementations of the disclosure. The electronic device 2 may include, but is not limited to, a mobile terminal device such as a mobile phone, a tablet computer, a notebook computer, a palmtop computer, a PC, a PDA, a PMP, a navigation apparatus, a wearable device, a smart bracelet, or a pedometer, or a fixed terminal device such as a digital TV, a desktop computer, etc. The electronic device 2 may include the induction coil 4 and the battery 5. When the charging device 1 starts charging, the charging coil 31 and the induction coil 4 cooperate to charge the battery 5. The charging device 1 is provided in the above implementations of the disclosure, the driving assembly 30 and the charging coil 31 cooperate to adjust the position of the charging coil 31, so that the charging coil 31 can face the induction coil 4, thereby adapting to different models and states of the electronic devices 2 and improving the charging efficiency of the charging device 1.

The implementations of the disclosure are described in detail above. Principles and implementation manners of the disclosure are elaborated and explained herein. The above illustrations are merely used to help understanding of methods and core ideas of the disclosure. Moreover, those skilled in the art may make modifications to the specific implementation manners and application scopes according to the ideas of the disclosure. In summary, contents of this specification should not be construed as limiting the disclosure.

What is claimed is:

1. A charging device, comprising:

a first housing;

a second housing defining a receiving space, wherein the second housing is rotatably connected with the first housing, and the second housing is configured to hold an electronic device; and a driving assembly and a charging coil, wherein the driving assembly and the charging coil are both received in the receiving space, and the driving assembly is connected with the charging coil and configured to drive the charging coil to move in the receiving space;

wherein the first housing defines an accommodating space, wherein the charging device further comprises a motor assembly received in the accommodating space and connected with the second housing, wherein the motor assembly is configured to drive the second housing to rotate relative to the first housing; wherein the charging device further comprises a processor, a first switch and a second switch received in the accommodating space, the processor is electrically connected with the motor assembly, the first switch and the second switch, wherein the processor is configured to send a first control signal to the motor assembly to start the motor assembly, and configured to send a second control signal to the motor assembly to stop the motor assembly;

wherein the processor is configured to send the second control signal to the motor assembly in response to a pressing duration of the first switch being less than the preset duration and a rotation angle of the second housing being equal to a preset angle, or the processor is configured to send the second control signal to the motor assembly in response to the pressing duration being greater than or equal to the preset duration and removal of a touch force on the first switch.

2. The charging device of claim 1, wherein the driving assembly comprises a motor and a slider, wherein the motor is connected with the slider, the slider is connected with the charging coil, the motor is configured to drive the slider to slide, and the charging coil moves along with sliding of the slider.

3. The charging device of claim 2, wherein the driving assembly further comprises a lead screw, wherein the lead screw has one end rotatably connected with the motor, and the slider is sleeved on the lead screw and provided with a first sliding portion; the charging device further comprises a second sliding portion connected with the second housing, wherein the first sliding portion cooperates with the second sliding portion and enables the slider to slide under rotation of the lead screw driven by the motor.

4. The charging device of claim 3, wherein the second housing comprises a bottom wall and a side wall that is connected with and bent relative to a periphery of the bottom wall, wherein the bottom wall and the side wall cooperate to define the receiving space; the charging device further comprises a support member connected with the bottom wall, and the second sliding portion is disposed on a side surface of the support member away from the bottom wall.

5. The charging device of claim 4, wherein the slider comprises a connecting portion and sliding blocks respectively protruding from opposite ends of the connecting portion, wherein the connecting portion is sleeved on the lead screw, the support member defines sliding grooves on the side surface of the support member away from the bottom wall, and the sliding blocks cooperate with the sliding grooves to slide the slider.

6. The charging device of claim 3, wherein the driving assembly further comprises a support member and a first guide rod, wherein the support member comprises a bottom plate and side plates that are respectively connected with and bent relative to opposite ends of the bottom plate, the bottom plate and the side plates cooperate to define a sliding space, and the slider is received in the sliding space, wherein the side plate defines a first through hole, and the lead screw extends through the first through hole and the slider, and wherein the side plate defines a second through hole, the slider defines a third through hole, the first guide rod is connected with the side plate and extends through the second through hole and the third through hole, and the slider is slidable on the first guide rod through the third through hole.

7. The charging device of claim 6, wherein the driving assembly further comprises a connecting member, wherein the charging coil is disposed on the connecting member, and the connecting member has one end connected with the slider and the other end that is slidable relative to the support member.

8. The charging device of claim 7, wherein the driving assembly further comprises a second guide rod, the side plate defines a fourth through hole, and the connecting member defines a fifth through hole, wherein the second guide rod is connected with the side plate and extends through the fourth through hole and the fifth through hole, and the connecting member is slidable on the second guide rod through the fifth through hole.

9. The charging device of claim 2, wherein the driving assembly further comprises a gear assembly and a rack, wherein the gear assembly has one end rotatably connected with the motor and the other end meshed with the rack, the rack is connected with the slider, the motor is configured to drive the gear assembly to rotate, the rack is configured to move along with rotation of the gear assembly, and the slider is configured to slide with movement of the rack.

10. The charging device of claim 1, further comprising a communication component received in the accommodating space and electrically connected with the processor, wherein the communication component is configured to receive at least one of a third control signal or a model signal from a terminal device, and further configured to send at least one of the third control signal or the model signal to the processor, and wherein when the third control signal is received by the processor, the processor is configured to control the motor assembly to move according to the third control signal to enable the second housing to rotate relative to the first housing, and when the model signal is received by the processor, the processor is further configured to control the driving assembly to move according to the model signal to enable the charging coil to correspond to an induction coil of the electronic device.

11. The charging device of claim 1, further comprising a distance sensor received in the accommodating space, wherein the distance sensor is connected with the motor assembly and electrically connected with the processor, and wherein:

during operation of the motor assembly, the distance sensor is configured to send a distance signal to the processor, and the processor is further configured to obtain a rotation angle of the second housing according to the distance signal, and wherein the processor is further configured to determine whether the rotation angle of the second housing is greater than or equal to a preset angle, and the processor is further configured to send the second control signal to the motor assembly to stop the motor assembly in response to the rotation angle of the second housing being greater than or equal to the preset angle.

12. The charging device of claim 1, further comprising a speaker received in the accommodating space and electrically connected with the processor, wherein the processor is further configured to send an audio signal to the speaker to make the speaker sound when the processor sends the first control signal to the motor assembly, and wherein the processor is further configured to stop sending the audio signal to the speaker when the processor sends the second control signal to the motor assembly.

13. The charging device of claim 1, wherein:

the first switch is configured to send a vertical signal to the processor in response to pressing of the first switch, and the processor is further configured to send the first control signal to the motor assembly according to the vertical signal, the motor assembly is configured to drive the second housing to rotate in a first direction; and the second switch is configured to send a horizontal signal to the processor in response to pressing of the second switch, and the processor is further configured to send a fourth control signal to the motor assembly according to the horizontal signal, the motor assembly is configured to drive the second housing to rotate in a second direction, wherein the first direction is opposite to the second direction.

14. The charging device of claim 13, wherein the processor is further configured to obtain a pressing duration of the first switch according to the vertical signal and determine whether the pressing duration is less than a preset duration, and the processor is configured to send the second control signal to the motor assembly in response to the pressing duration being less than the preset duration and the rotation angle of the second housing being equal to the preset angle, or the processor is configured to send the second control signal to the motor assembly in response to the pressing duration being greater than or equal to the preset duration and removal of the touch force on the first switch.

15. An electronic device assembly, comprising a charging device and an electronic device placed on the charging device for charging, wherein:

the charging device comprises:

a first housing;

a second housing defining a receiving space, wherein the second housing is rotatably connected with the first housing, and the second housing is configured to hold the electronic device; and a driving assembly and a charging coil, wherein the driving assembly and the charging coil are both received in the receiving space, and the driving assembly is connected with the charging coil and configured to drive the charging coil to move in the receiving space;

wherein the first housing defines an accommodating space, wherein the charging device further comprises a motor assembly received in the accommodating space and connected with the second housing, wherein the motor assembly is configured to drive the second housing to rotate relative to the first housing; wherein the charging device further comprises a processor, a first switch and a second switch received in the accommodating space, the processor is electrically connected with the motor assembly, the first switch and the second switch, wherein the processor is configured to send a first control signal to the motor assembly to start the motor assembly, and configured to send a second control signal to the motor assembly to stop the motor assembly;

wherein the processor is configured to send the second control signal to the motor assembly in response to a pressing duration of the first switch being less than the preset duration and a rotation angle of the second housing being equal to a preset angle, or the processor is configured to send the second control signal to the motor assembly in response to the pressing duration being greater than or equal to the preset duration and removal of a touch force on the first switch; and the electronic device comprises an induction coil and a battery, wherein the charging coil and the induction coil cooperate to charge the battery.

16. The electronic device assembly of claim 15, wherein the driving assembly comprises a motor and a slider, wherein the motor is connected with the slider, the slider is connected with the charging coil, and the motor is configured to drive the slider to slide to enable the charging coil to move with sliding of the slider.

17. The charging device of claim 10, further comprising a holder disposed on the first housing, wherein the charging device has a horizontal state and a vertical state, wherein the holder and a side surface of the second housing away from the first housing cooperate to define a positioning recess when the charging device is in the vertical state, wherein the positioning recess is configured to position the electronic device;

wherein in the horizontal state, the second housing is parallel to the first housing, and in the vertical state, the second housing is angled relative to the first housing.

18. The charging device of claim 17, wherein the processor is configured to control the motor assembly to move according to the third control signal when the charging device is in the horizontal state, and wherein the processor is configured to control the driving assembly to move according to the model signal when the charging device is in the vertical state and the electronic device abuts against the holder.

* * * * *